(12) United States Patent
Krasnov

(10) Patent No.: US 8,496,048 B2
(45) Date of Patent: Jul. 30, 2013

(54) VORTICAL BOILING PHENOMENON BASED WATER COOLING BLOCK

(75) Inventor: Yuriy K. Krasnov, Richmond Hts., OH (US)

(73) Assignee: Qualitics, Inc., Richmond Hts., OH (US)

(*) Notice: Subject to any disclaimer, the term of this patent is extended or adjusted under 35 U.S.C. 154(b) by 203 days.

(21) Appl. No.: 12/930,658

(22) Filed: Jan. 14, 2011

(65) Prior Publication Data

US 2011/0180236 A1    Jul. 28, 2011

(51) Int. Cl.
*F28F 7/00* (2006.01)
(52) U.S. Cl.
USPC ............... 165/80.2; 165/80.4; 165/104.21
(58) Field of Classification Search
USPC .......... 62/515, 235.1, 402, 260; 165/104.11, 165/109.1, 104.19, 80.4, 104.21, 104.22, 165/104.27, 104.29, 139, 166, 80.2
See application file for complete search history.

(56) References Cited

U.S. PATENT DOCUMENTS

| 4,569,391 A * | 2/1986 | Hulswitt et al. ............. 165/166 |
| 2009/0114372 A1 * | 5/2009 | Ippoushi et al. ......... 165/104.14 |

* cited by examiner

*Primary Examiner* — Mohammad M Ali

(57) ABSTRACT

A convective cooling cell is providing the vortical boiling regime of flow of coolant inside of it that allows exploiting important advantages of the vortical boiling phenomenon: highest coefficient of the heat transfer at very small increase of the hydro-resistance, unchangeable or even increasing performance (thermo-resistance) at increase of the coolant's discharge, and anti-adhesive action of stream inside the cooling cell.

The cell comprises a heat intake box, inlet-diffuser channel and outlet-confuser channel with couplers on their ends for convenient connection with the external coolant supplying system.

The dense triangular lattice of non-potential segmental spherical dimples on the top and bottom inner sides of the heat intake box provides self-generation of a coherent system of vortical tubes of coolant that effectively are sucking heat from the heat-generating body that is in reliable thermal contact with external surface of the attached wall of said heat intake box.

Essentially, the cell allows many technologies of manufacturing: milling, stamping, melting, and/or their combinations.

3 Claims, 12 Drawing Sheets

VORTICAL BOILING PHENOMENON BASED WATER COOLING BLOCK

BACKGROUND OF THE INVENTION

1. Field of the Invention

The present invention relates generally to an apparatus for and a method of cooling of heat generating surfaces, and more particularly—to the convective cooling of computer microprocessors (integrated circuits) that are producing a high level of heat.

2. Description of the Related Art

Thirty years ago new phenomena in hydrodynamics forced a re-examination of the entire approach to the efficiency problem in convective cooling processes. The central problem was to overcome the losses of efficiency of convective cooling with the increasing of the coolant's velocity. The solution was in the study of laminar flow, which is based on the premise that fields of velocity of any stable flow are determined locally if the source of energy, the boundary walls, and free surfaces are all known. It was discovered that there are two types of dimples on the globally smooth surfaces: those that are allowing a laminar streamlining were called a potential dimples and those that do not allowing any laminar streamlining, even at arbitrarily small velocities of the fluid, were called non-potential dimples.

The investigation of said non-potential dimples has lead to the discovery of a new type of self-organization of the fluid at streamlining of cavities: the vortical boiling phenomenon.

This type of flow was predicted, discovered and investigated in 1980-85 in the Khurchatov Institute of the Atomic Energy in Moscow (Russia) (see, for example, [1-2], and the cumulative report [3]) and its physical nature and features were described and explained in series of works of S. T. Belyaev and Y. K. Krasnov [4-6]. During following 30 years this type of flow was exploit by many groups for many areas of applications (Detailed report on that matter one can find on www.thequalities.com in [7], "Vortical Boiling Technique").

The essence of vortical boiling phenomenon is in the fact that the surface of a non-potential dimple generates so-called Rotons—the smallest laminar rotating inviscid excitations of the streamlining fluid. These Rotons are growing in numbers and become self-organized in a mesoscopic vortex inside dimple until the size of this vortex will exceed some critical level at given rate of the flow of the streamlining fluid. After that said vortex with entire its fluid atmosphere is ejected from the dimple, leaving a space for creation of the next one, and so on. Like air bubbles at the boiling of water, said generated vortices, surrounded by their fluid atmospheres, are heated up to surface temperature, and, therefore, do carry out a lot of heat.

Because said vortices with their fluid atmospheres are laminar inviscid excitations of the streamlining fluid, they do not increase the turbulence of said fluid (see the cumulative report [3]). This feature of vortical boiling together with highly efficient heat transfer on the streamlined surface accompanied with incredibly small hydraulic resistance delivers the solution of the mentioned central problem of the entire convective heat exchange technique, which is to overcome losses of efficiency of the convective cooling with the increasing of the coolant's velocity.

The present invention is a novel application of vortical boiling flows for cooling of computer microprocessors (integrated circuits) that are producing a high level of heat. The present invention solves a long-standing problem of providing of the equally effective convective cooling at the wide range of generated heat power due to a simple measure: appropriate changes of the velocity of the coolant that is flowing over the heated surface.

SUMMARY OF THE INVENTION

It is an object of the present invention to teach means of using of the all profound features of the vortical boiling phenomenon at convective cooling of the highly heated devices, and particularly—computer integral circuit chips It is an object of the present invention to teach means how to avoid a high hydro-resistance in the channel of a cooling cell while saving the heat transfer in this channel on extremely efficient level.

BRIEF DESCRIPTION OF THE DRAWINGS

Advantages and features of the present invention are better understood with reference to the following and more detailed description and claims taken in conjunction with accompanying drawings, in which like elements are identified with like symbols.

DESCRIPTION OF THE PREFERRED EMBODIMENTS

The best mode for carrying out the invention is presented in terms of its preferred embodiment, herein depicted within the Figures.

Figure 1:
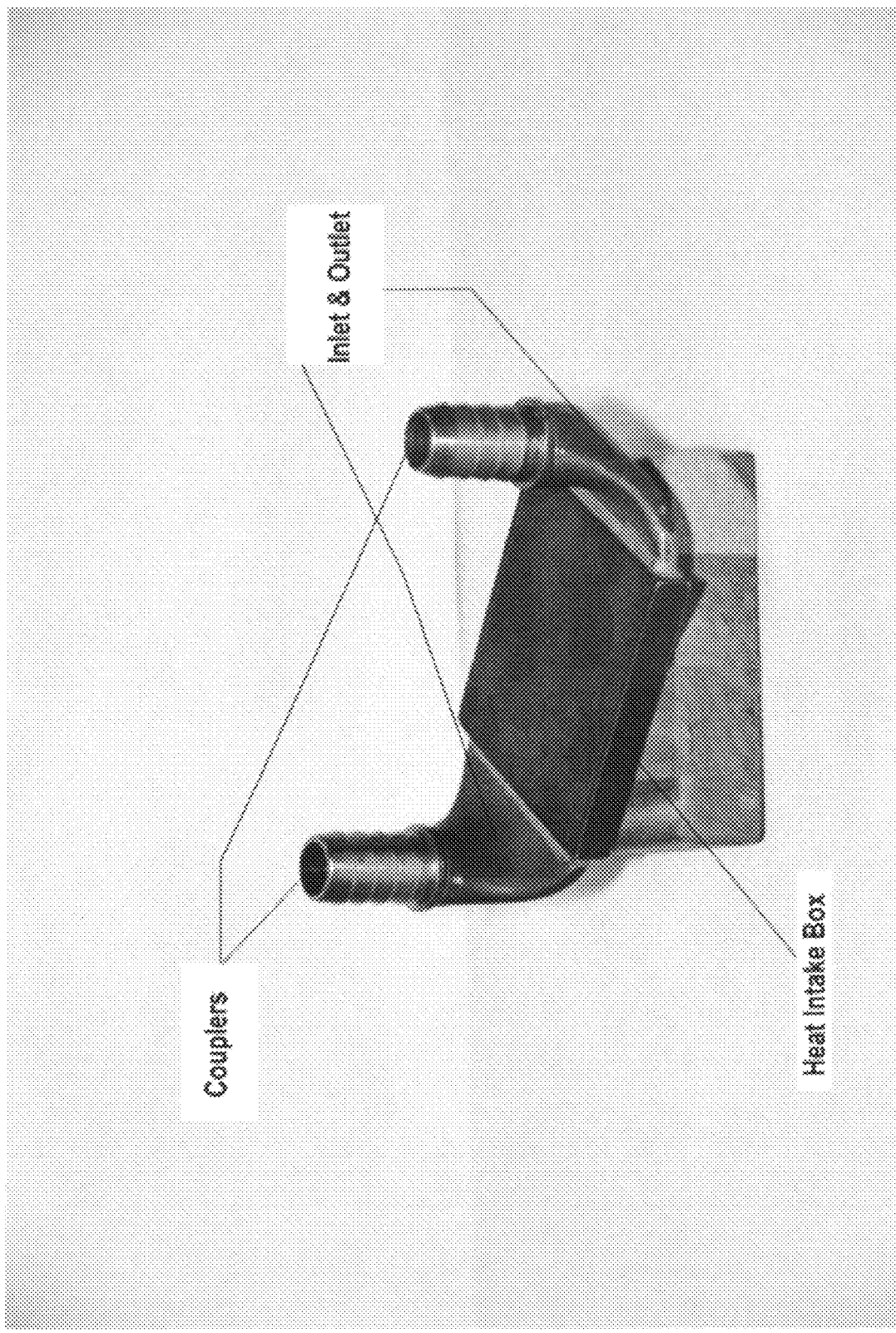
FIG. 1 shows a built model QualiCell of the computer chips cooler based on the methods and principles that are disclosed in the present invention.
Figure 2:
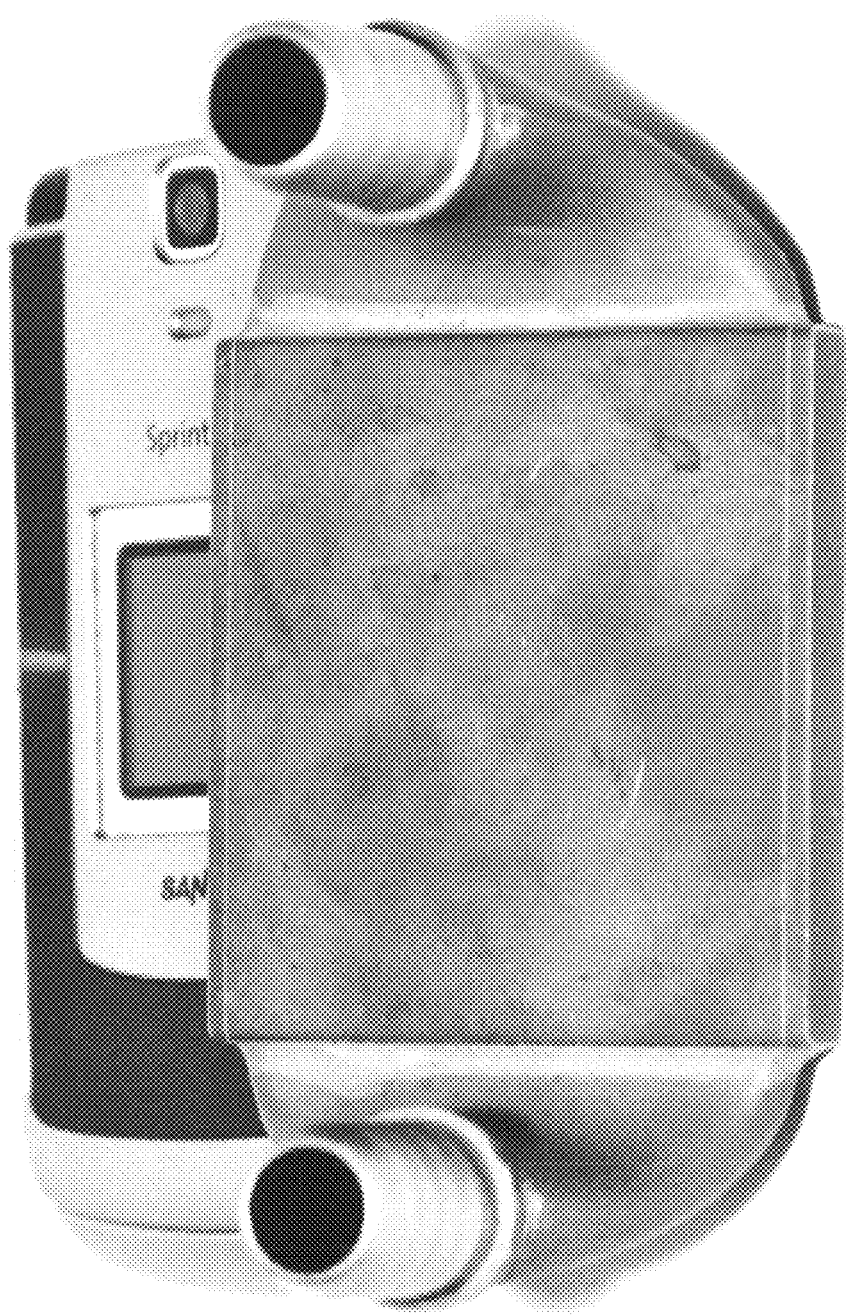
FIG. 2 shows a comparison of QualiCell with standard SANYO Cell phone.

A preferred embodiment of the present invention is the model QualiCell that is shown in FIG. 1-2. Due to two (for example, elastic) tubes that are fixed (using appropriate standard bandages, if necessary) on the two couplers on the ends of inlet and outlet channels of QualiCell, the device can be incorporated into any appropriate coolant transport system, which will provide device with continuous flow of said coolant through the heat intake box.

Figure 3:
FIG. 3 shows a side view of Inlet (Outlet) channel that is used in QualiCell
Figure 4:
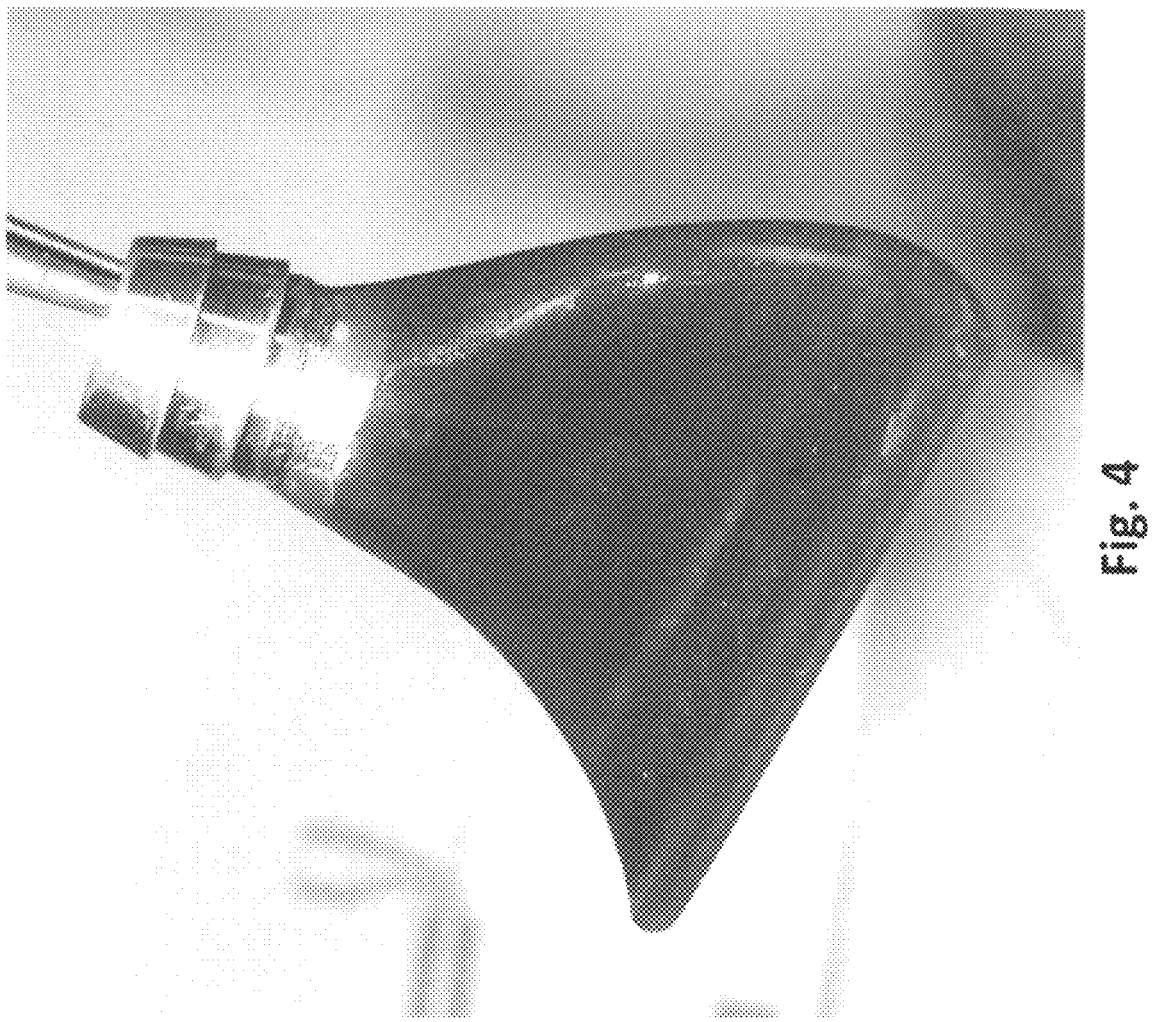
FIG. 4 shows a face view of Inlet (Outlet) channel that is used in QualiCell.
Figure 5:
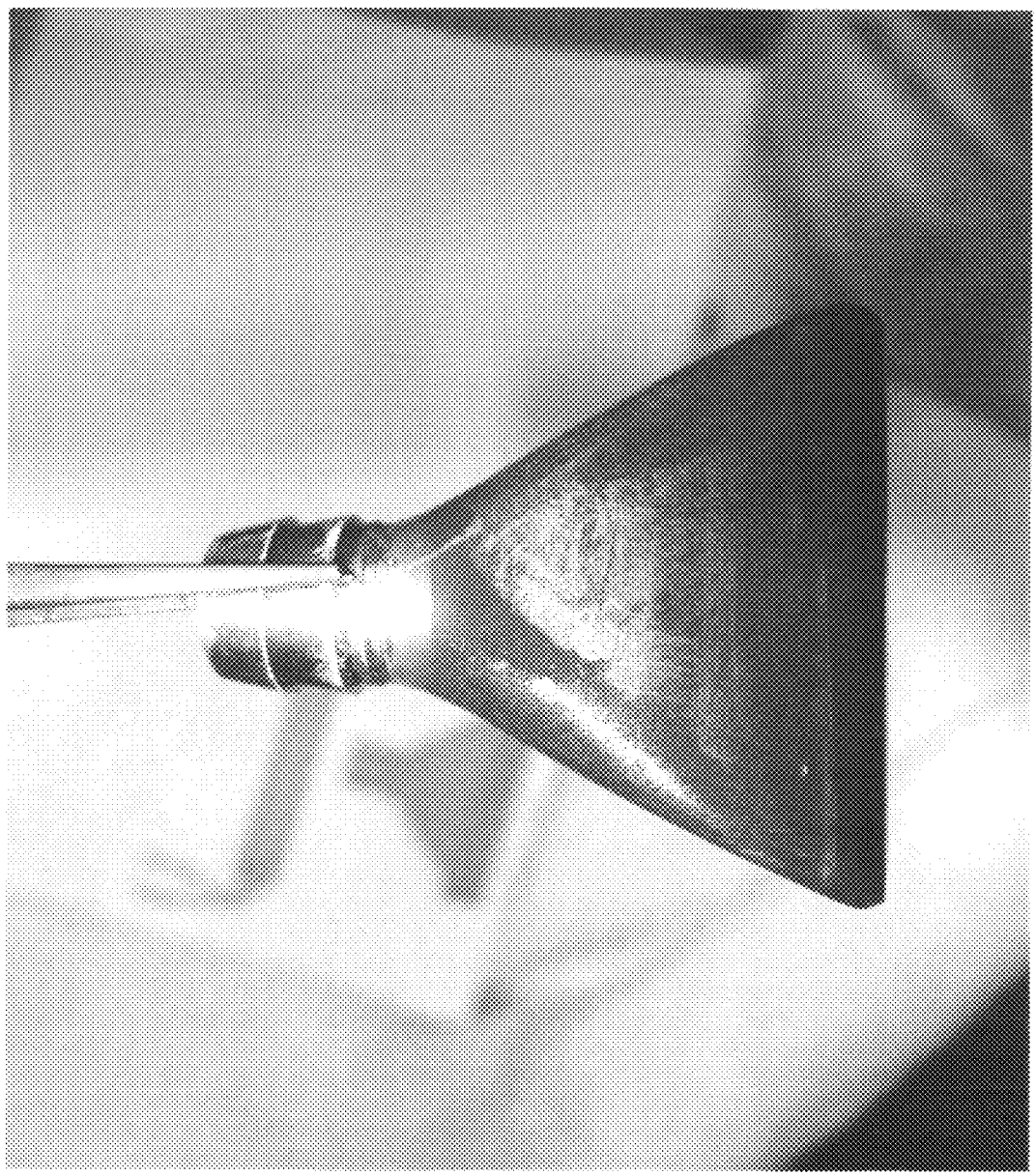
FIG. 5 shows a back view of Inlet (Outlet) channel that is used in QualiCell.
Figure 6:
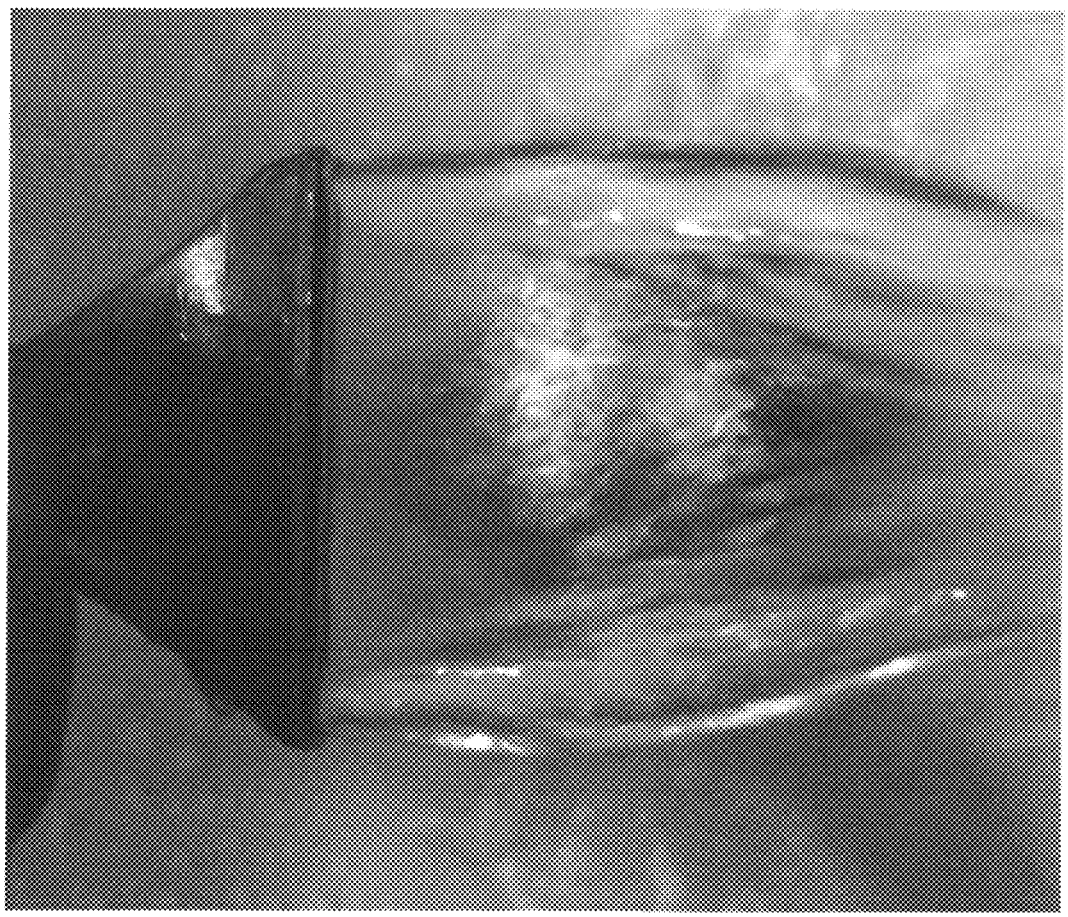
FIG. 6 shows a structure of flow from the used Inlet channel.

The coolant flows into the specifically shaped (see FIG. 3-5) inlet channel and gradually takes shape of uniform flat stream (see FIG. 6) on the entrance into the heat intake box. Therefore, inside the heat intake box the regime of steady uniform flow of coolant is realized. This steady uniform non-broken inflow of coolant is a crucial condition for development of the vortical boiling regime inside the heat intake box. Therefore, inlet channel has to be constructed with exact directives of the technical hydrodynamics in respect to the hydraulic laminar diffusers. For the same purpose the outlet channel also has to be constructed with exact directives of the technical hydrodynamics in respect to the hydraulic laminar confusers.

Figure 7:
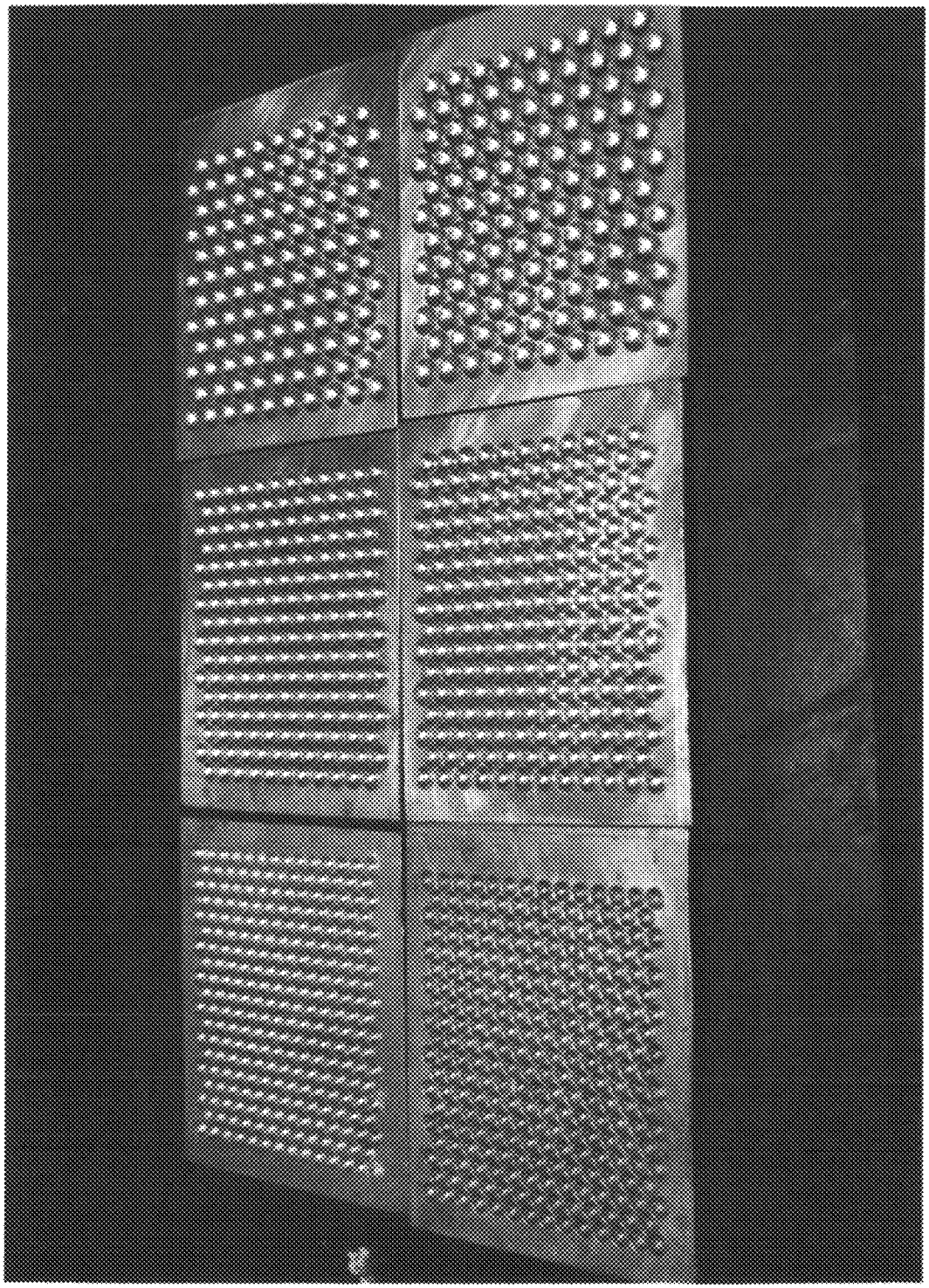
FIG. 7 shows a few types of the triangular lattices of segmental spherical dimples that should be used in the heat intake box of cooling devices to provide vortical boiling regime of flow of the coolant in it.
Figure 8:
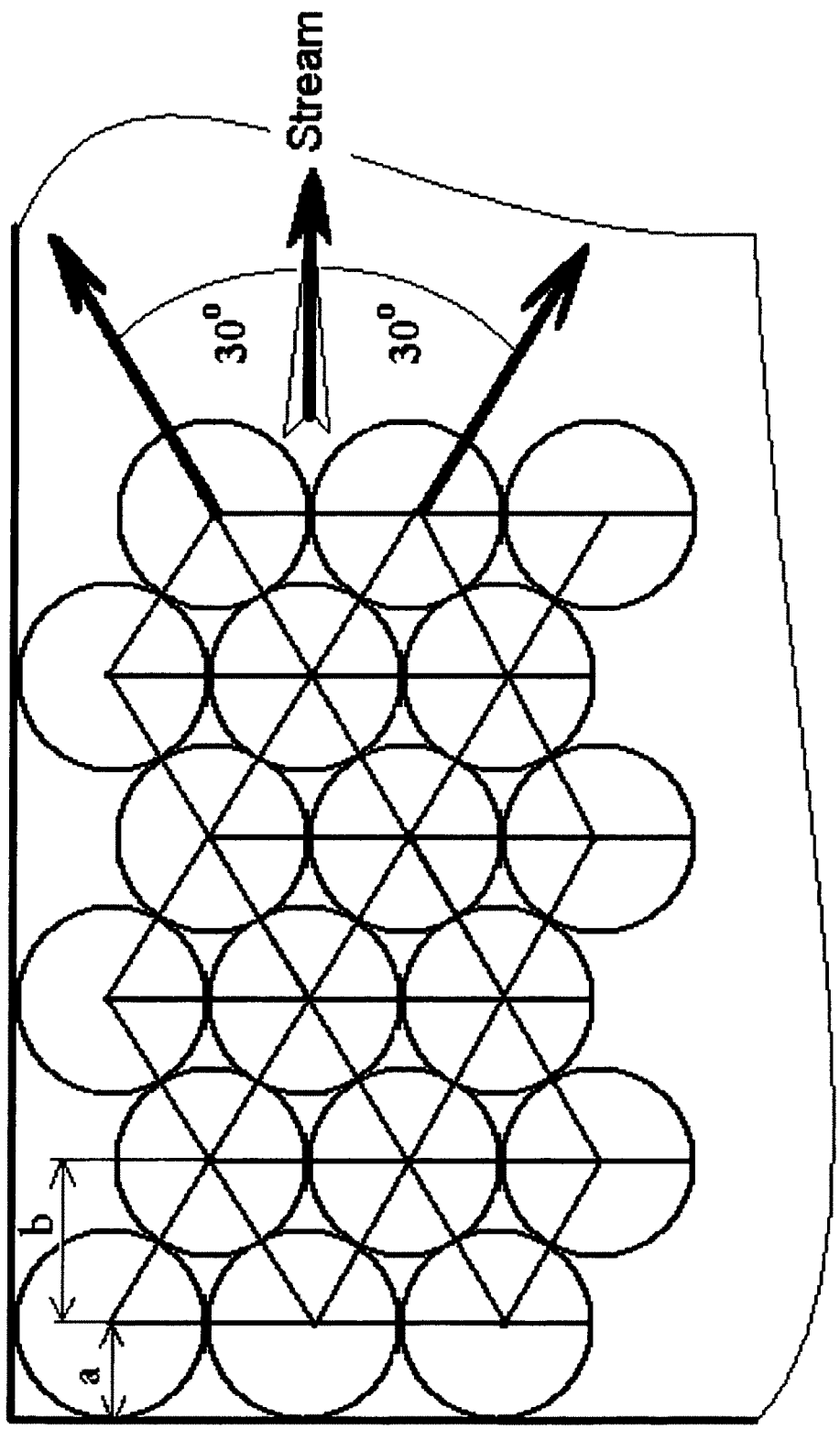
FIG. 8 shows the orientation of the dense triangular lattice of the segmental spherical dimples against direction of the coolant's core flow (shown by arrow "Stream"). The distance between any two neighbor dimples is called "parameter p" of said triangular lattice. Shown triangular lattice of the segmental spherical dimples is a dense lattice because parameter of lattice, p, is chosen to be twice longer than the edge radius a of a single segmental spherical dimple, i.e. p=2a, so that dimples are touching each other. The distance between any two neighbor dimples that are lying along the same straight streamline of the coolant's core flow is called as "step s" of said lattice. At different orientation of the same triangular lattice in respect to straightforward stream of the coolant's core flow there can be different step s. This Figure shows the orientation of the implemented triangular lattice of dimples in regard to the coolant's straightforward core flow at which the maximal efficiency of the vortical boiling phenomena is revealed. At this orientation the step s of lattice becomes equal to 2b, where b=√3 a, i.e. s=√3p. The directions of sanding of dimples with sandpaper (grinding) are shown by black arrows directed under 30° angles to the direction of the coolant's core flow.
Figure 9:
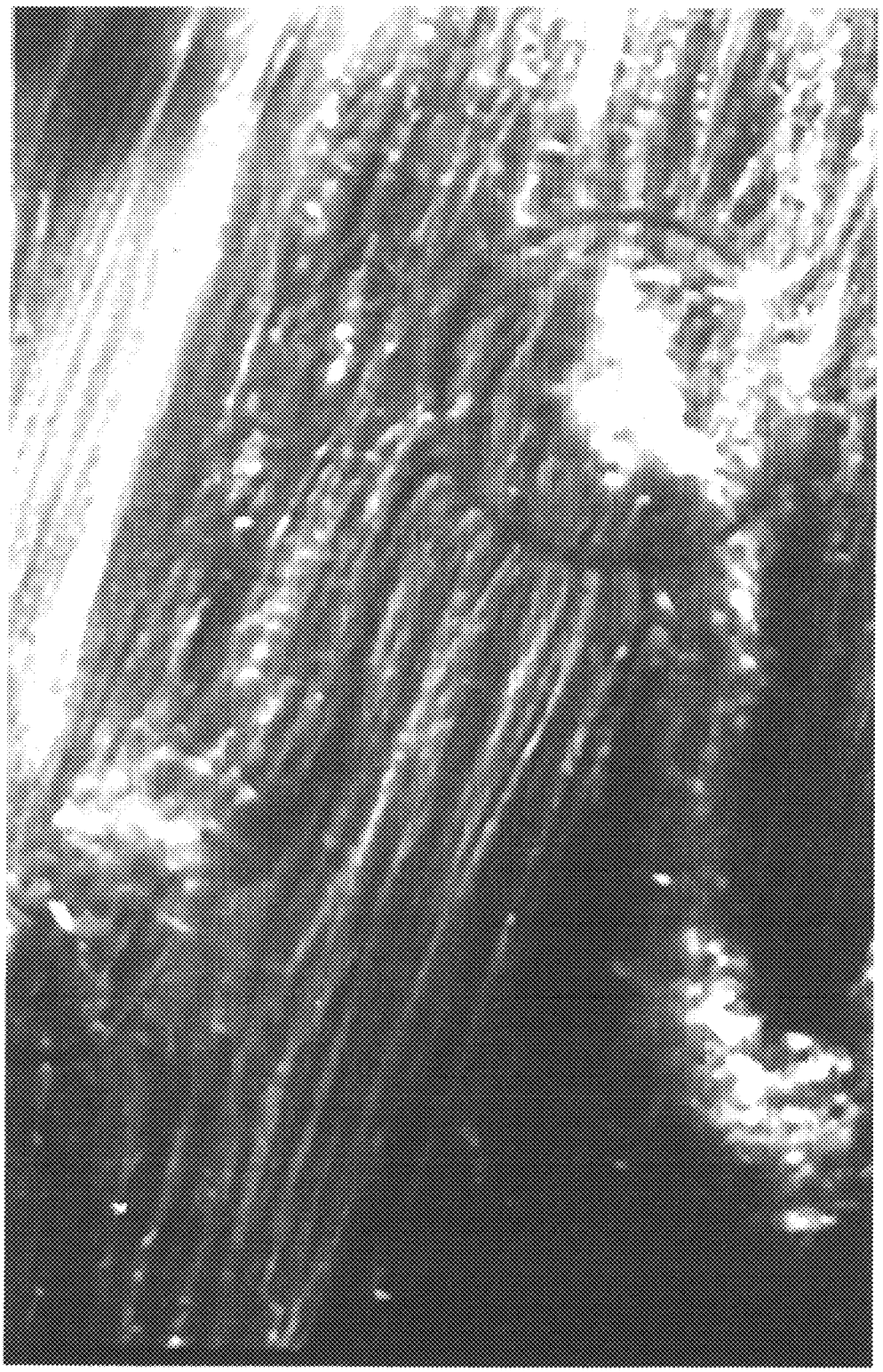
FIG. 9 shows the structure of flow over triangular lattice of the non-potential dimples in the regime of well-developed vortical boiling streamlining. Generally, each dimple generates two vortical tubes that are connecting this dimple with two neighbor dimples placed along the stream.

The inner top and bottom surfaces of the heat intake box have the shape of an appropriate triangular lattice of dimples (see FIG. 7) that do not allow a potential streamlining by the coolant at any velocity of coolant, so that the vortical boiling regime of streamlining has to develop. The mutual orientation of said lattice and core flow of the streamlining coolant is shown in FIG. 8, so that in the well-developed stage of the vortical boiling regime of streamlining the picture of the flow inside the heat intake box has a structure as it is shown in FIG. 9. In order to provide the most favorable conditions for development of the vortical boiling regime of streamlining, like one that is shown in FIG. 9, it is important to implement the sanding of the lattice of dimples with a sandpaper (or any equivalent technology; for example—by a rotary sand-disk). Such sanding of lattice in the directions under 30° angles to the direction of the coolant's core flow (said directions are shown in FIG. 8 by a black arrows) provide easy ways (saddle-like paths) for the generated vortices to escape dimple and reach a neighbor one, as it is clearly shown in FIG. 9.

Figure 10:
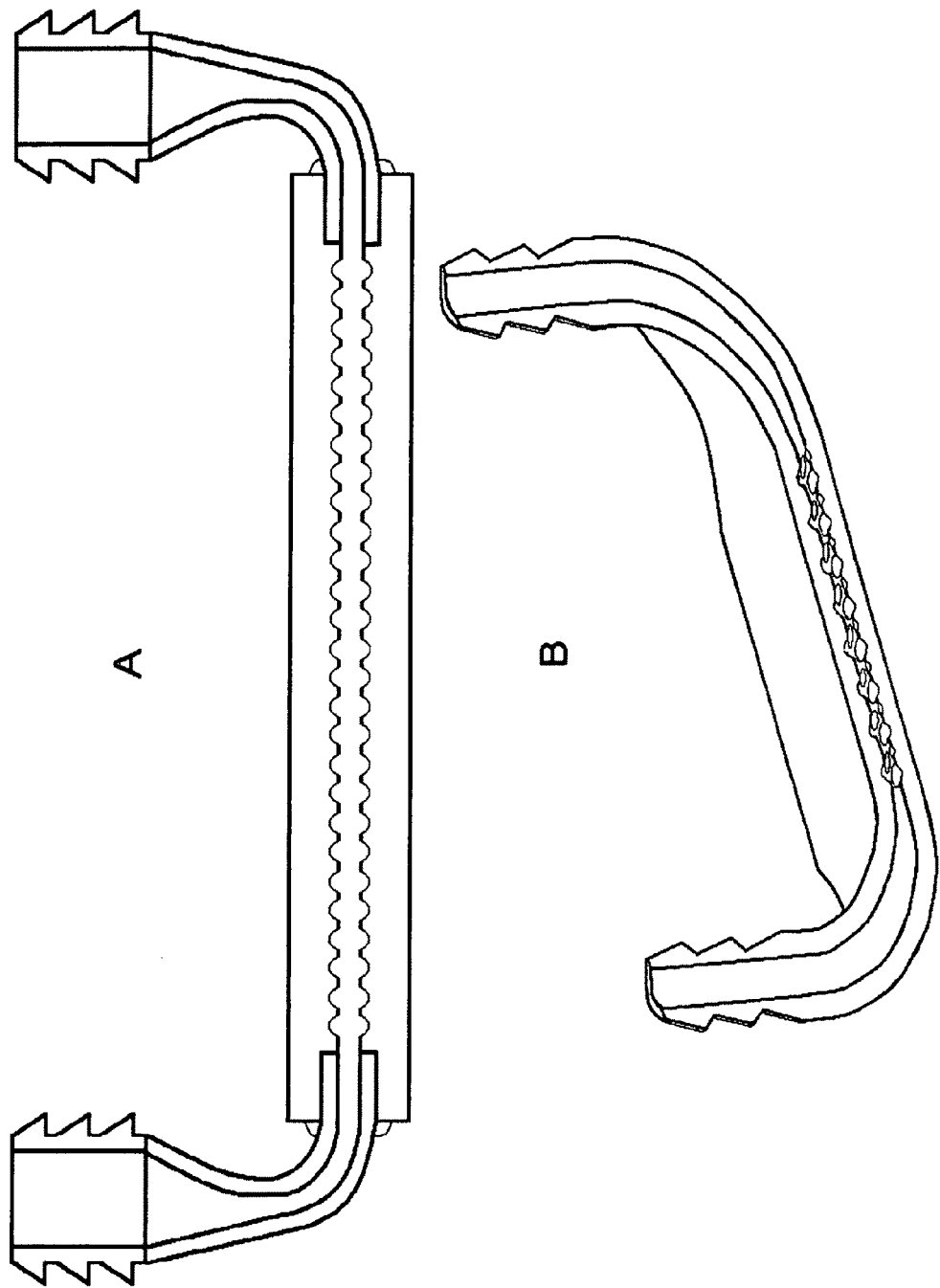
FIG. 10 shows schematics of conjugation of the streamlined lattices of dimples inside QualiCell to avoid parasitic turbulization of coolant's flow inside the heat intake box.

It is important to avoid any parasitic turbulization of stream of coolant all over convective cooling cell, what requires proper conjugation of all heat exchange surfaces inside of it, as it is shown in FIG. 10—dimple of the top inner surface of the heat intake box should be suited over a corresponding dimple on the bottom inner surface of said box.

Figure 11:
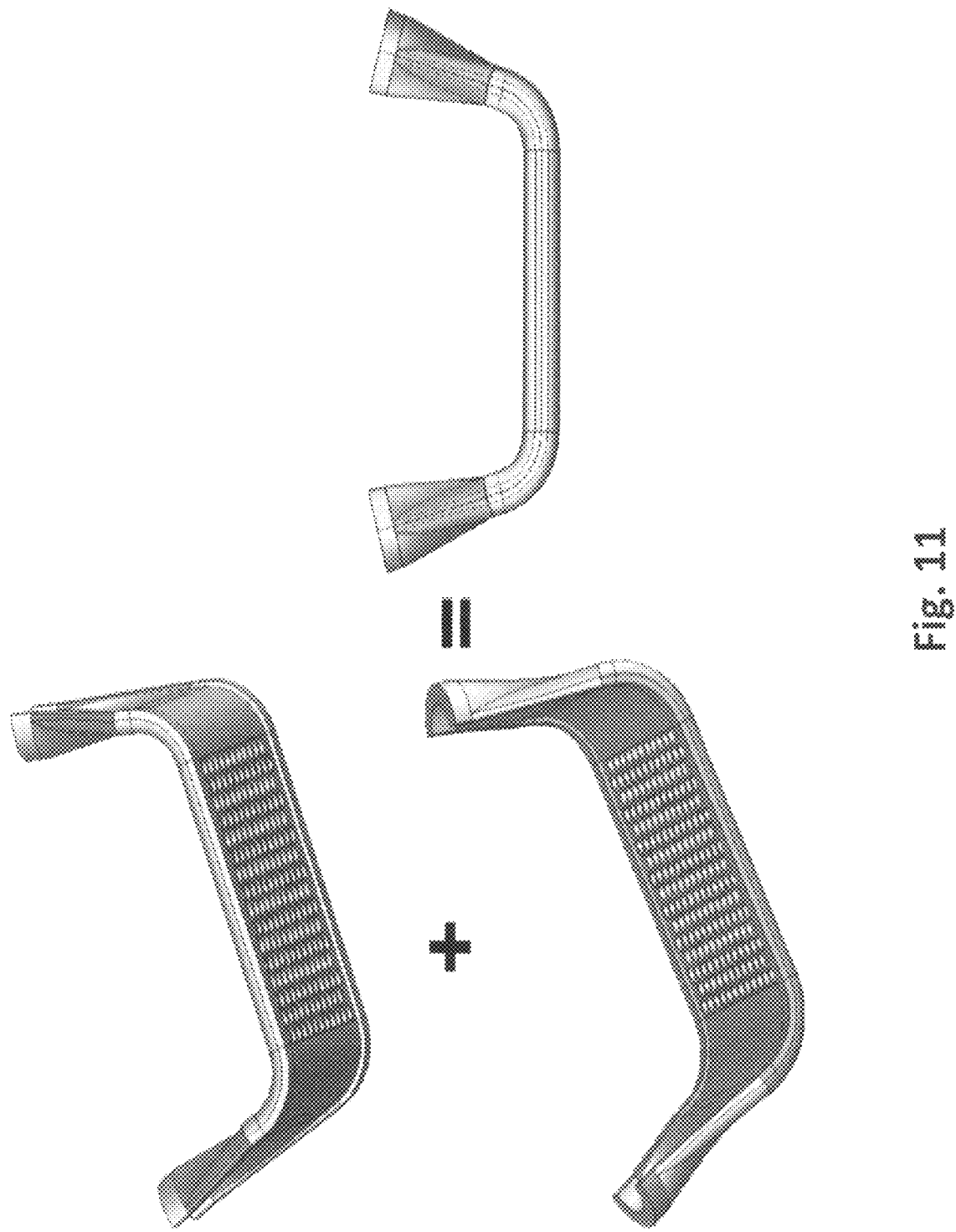
FIG. 11 shows schematics of assembling QualiCell of two parts—Upper half and Lower half of it that could be manufactured through the stamping or melting processes.

In another embodiment, the invented convective cooling cell, as a whole, can be assembled from only two parts—Upper half and Lower half of it, as it is shown in FIG. 11. Each of these parts could be manufactured through the single stamping. Being soldered or welded one on top of other, those parts accomplish said convective cooling cell. This possibility is absolutely non-trivial technological advantage of the present invention in regard to manufacturing, because, for instance, the model QualiCell (that is shown in FIG. 1) does not provides such a possibility. In general, not every device can be divided in two parts, each of which can be produced by a single stamping technology (that follows from a general topology). FIG. 11 illustrates that and how the present invention allows such a possibility.

Figure 12:
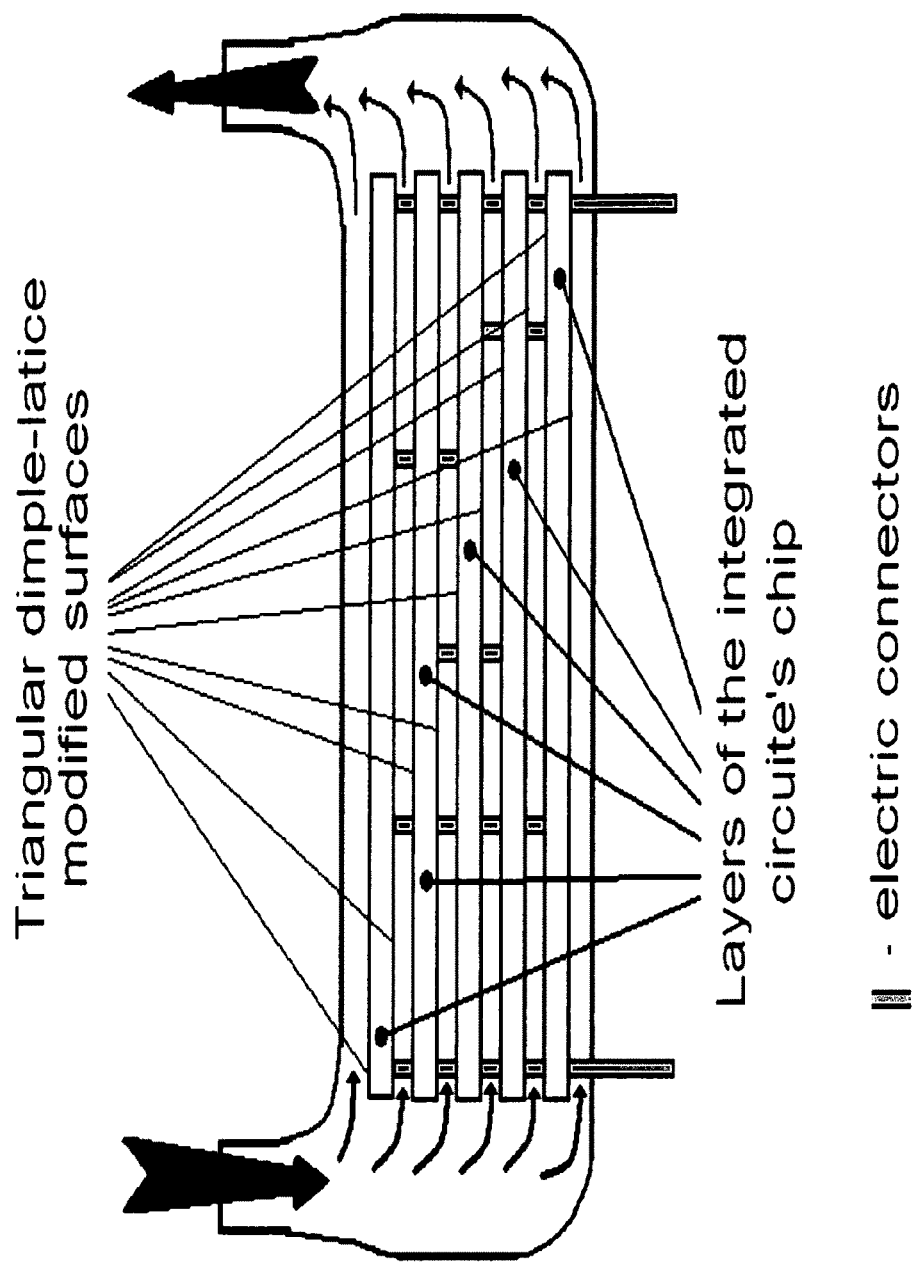
FIG. 12 shows schematics of a multi-layer setting of coolant channels in the same cooling cell when heat generating layers of an integral circuit are suited between said channels

Because the present invention is realizing the unique feature of vortical boiling as the highly efficient heat transfer on the streamlined surface accompanied with incredibly small hydraulic resistance, it allows another embodiment, where multi-layer setting of coolant channels in the same cooling cell are formed by the heat generating layers of an integral circuit, the external surfaces of which are modified with triangular lattice of segmental spherical dimples, and which are suited horizontally on some distance from each other along a vertical direction, and which are electrically connected due to set of tiny vertical posts, so that channels for coolant's flow are created as spaces between said layers, as it is shown schematically in FIG. 12.

The foregoing descriptions of specific embodiments of the present invention are presented for purposes of illustration and description. They are not intended to be exhaustive or to limit the invention to precise forms disclosed and, obviously, many modifications and variations are possible in light of the above teaching. The embodiments are chosen and described in order to best explain principles of the invention and its practical application, to thereby enable others skilled in the art to best utilize the invention and its various embodiments with various modifications as are suited to the particular use contemplated. It is intended that a scope of the invention be defined broadly by the Drawings and Specification appended hereto and to their equivalents. Therefore, the scope of the invention is in no way to be limited only by the following exemplary claims nor by any possible, adverse inference under the rulings of *Warner-Jenkinson Company, v. Hilton Davis Chemical,* 520 US 17 (1997) or *Festo Corp. V. Shoketsu Kinzoku Kogyo Kabushiki* Co., 535 U.S. 722 (2002), or other similar case law or subsequent precedent should not be made if such claims are amended subsequent to this Utility Patent Application.

REFERENCES

[1] G. L Kiknadze, Y. K. Krasnov, N. F. Podymaka, and V. B. Khobenski, "*Self-organization of vortex structures in water flowing over a hemispherical cavity*", Doklady Academia Nauk SSSR, vol. 291, p. 0315 (1986).

[2] "*The heat exchange surface*", USSR Patent 1554537, priority by May 29, 1987.

[3] I. A. Gachechiladze, G. L Kiknadze, Y. K. Krasnov, et all, "*Heat/mass transfer*", MIF, "*Heat transfer with self-organization of whirlwind-like structures*", The problem reports, Sessions 1-2. "Convective, irradiated, and compound heat transfers". Minsk (USSR), 1988, pp. 270.

[4] S. T. Belyaev, Y. K. Krasnov, *The vortex and the ditch-streaming*, Preprint No 217-90 of the Sibirian Division of The Academia of Science of USSR, Novosibirsk, (1990).

[5] Belyaev, S. T., Krasnov, Y. K., "*On the intrinsic mass of a singular vortex thread*", Doklady Academia Nauk SSSR, 1991, vol. 319, No. 1, pp. 150-153.

[6] Y. K. Krasnov, *The Dynamics of Quantum Vortices*, (2001), E-book available on www.thequalitics.com

[7] "Vortical Boiling Technique", Developed by Qualitics, Inc. (USA) and BASERT (Russia), 2001, www.thequalitics.com

Having thus described the invention what is claimed as new and desired to be granted a patent is as follows:

1. A convective cooling cell, that being in good contact with a heated surface, providing an intake of heat from this surface and transport of it into an appropriate refrigerator by the fluid coolant that is passing through said cell, comprising:
   a heat intake box, the top and bottom inner surfaces of which are shaped in the form of triangular lattice of segmental spherical dimples;
   an inlet (diffuser) and outlet (confuser) coolant transporting channel;
   wherein:
   inlet channel is shaped as a diffuser, which provides a laminar uniform non-broken stream of coolant all over the entrance of the heat intake box;
   the coolant transporting channel into the heat intake box provides a straight-forward flow of coolant's core everywhere into said heat intake box from the entrance to the exit of said box;
   the triangular lattice of segmental spherical dimples on the top and bottom inner surfaces of the heat intake box is oriented in respect to the direction of the coolant's core flow so, that the distance between any two neighbor dimples, that are laying along the same straight streamline of coolant's core flow, is square root of 3 times longer than the parameter of said lattice;
   the triangular lattices of segmental spherical dimples on the top and
   bottom inner surfaces of the heat intake box are oriented in respect to each other so, that dimple of the top inner surface of the heat intake box is suited over a corresponding dimple on the bottom inner surface of said box;
   outlet channel is shaped as a confuser, which provides collection of a laminar non-broken stream of coolant all over the entrance of outlet channel and till its exit;
   dimples in the triangular lattice of segmental spherical dimples on the top and bottom inner surfaces of the heat intake box are grinded with a sandpaper along direction under 30 degrees in respect to the direction of stream of coolant's core into the heat intake box, in order to provide saddle-like path between dimples along direction of said grinding.

2. The apparatus of claim 1, further comprising only two parts that can be manufactured by a single stamping punch each—an upper part and a lower part that, being soldered or welded one on top of other, accomplish said convective cooling cell.

3. The apparatus of claim 1, wherein the heat intake cell comprises multi-layer set of channels for coolant's flow and heat generating layers of the integrated circuit are suited between those channels, just as it is illustrated in FIG. 12, so that each external surfaces of said layer of the integrated circuit, being modified by a dense triangular lattice of non-potential segmental spherical dimples, is forming a boundary wall of said channel for a liquid coolant, so that the entire setting is accomplishing a full integral chip genuinely containing a build-in convective cooling system that through a single common inlet-diffuser and a single common outlet-confuser easily can be connected with an external line of the coolant's transport.

* * * * *